US012604594B2

(12) United States Patent
Cheng

(10) Patent No.: US 12,604,594 B2
(45) Date of Patent: Apr. 14, 2026

(54) LIGHT-EMITTING STRUCTURE INCLUDING LIGHT-EMITTING UNITS WITH DIFFERENT AREAS

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 362 days.

(21) Appl. No.: 18/356,515

(22) Filed: Jul. 21, 2023

(65) Prior Publication Data

US 2024/0234479 A1 Jul. 11, 2024

(30) Foreign Application Priority Data

Jan. 11, 2023 (CN) ......................... 202310042196.X

(51) Int. Cl.
*H10H 29/14* (2025.01)
(52) U.S. Cl.
CPC .................................. *H10H 29/142* (2025.01)
(58) Field of Classification Search
None
See application file for complete search history.

(56) References Cited

U.S. PATENT DOCUMENTS

| | | | | |
|---|---|---|---|---|
| 2014/0217361 A1* | 8/2014 | Seong | ................. | H10H 20/817 |
| | | | | 438/34 |
| 2019/0131355 A1* | 5/2019 | Chae | .................... | G09G 3/3258 |
| 2021/0376008 A1* | 12/2021 | Tan | .......................... | G09G 3/20 |
| 2022/0037423 A1* | 2/2022 | Zhang | ................. | H10K 59/122 |
| 2022/0052242 A1* | 2/2022 | Ikeda | .................. | H10H 20/831 |
| 2024/0234478 A1* | 7/2024 | Cheng | ................. | H10H 20/825 |

* cited by examiner

*Primary Examiner* — Nduka E Ojeh
(74) *Attorney, Agent, or Firm* — Westbridge IP LLC

(57) ABSTRACT

A light-emitting structure includes: a first region and a second region surrounding the first region. The first region includes a plurality of first light-emitting units, and the second region includes a plurality of second light-emitting units. An area of the first light-emitting unit is greater than an area of the second light-emitting unit. The area of the second light-emitting unit in the second region arranged on the edge is relatively small, which improves a doping rate of a light-emitting element in the second region, so that doping rates of the light-emitting element of the light-emitting structure in the first region and the second the area tend to be equal, thereby solving a problem of uneven light-emitting wavelengths in the first region and the second region when the light-emitting unit is prepared by epitaxy.

14 Claims, 4 Drawing Sheets

LIGHT-EMITTING STRUCTURE INCLUDING LIGHT-EMITTING UNITS WITH DIFFERENT AREAS

CROSS-REFERENCE TO RELATED APPLICATION

This application claims priority to Chinese Patent application No. 202310042196. X, filed on Jan. 11, 2023, which is hereby incorporated by reference in its entirety.

TECHNICAL FIELD

The present application relates to the field of semiconductor technologies, in particular, to a light-emitting structure.

BACKGROUND

As a new generation of display technology, Micro Light Emitting Diode (Micro LED) has advantages including higher brightness, better luminous efficiency and lower power consumption compared to Liquid Crystal Display (LCD) and Organic Light Emitting Diode (OLED) technologies in conventional art.

Generally, for a manufacturing method of a Micro LED display device, a LED epitaxial wafer is usually grown epitaxially on a substrate firstly, then the LED epitaxial wafer is etched to form LED units, and a large number of LED units are transferred to a large-sized glass substrate. This process involves a number of times of transfer, which is also a reason for a low yield of the Micro LED display device.

SUMMARY

In view of this, embodiments of the present disclosure provide a light-emitting structure to solve a technical problem of uneven light-emitting wavelength in conventional technologies.

According to an aspect of the present disclosure, an embodiment of the present disclosure provides a light-emitting structure, including: a first region and a second region, where the second region surrounds the first region; the first region includes a plurality of first light-emitting units, the second region includes a plurality of second light-emitting units; and an area of the first light-emitting unit is greater than an area of the second light-emitting unit.

In an embodiment, areas of the plurality of first light-emitting units are equal.

In an embodiment, areas of the plurality of second light-emitting units are equal.

In an embodiment, the further away the first light-emitting unit from the second region is, the larger the area of the first light-emitting unit is.

In an embodiment, the closer the second light-emitting unit to the first region is, the larger the area of the second light-emitting unit is.

In an embodiment, an area of the first light-emitting unit is 1.1~2 times an area of the second light-emitting unit.

In an embodiment, a ratio of a light-emitting element content in an active layer of the first light-emitting unit to a light-emitting element content in the active layer of the second light-emitting unit ranges from 0.95 to 1.05.

In an embodiment, the active layer of the first light-emitting unit or the second light-emitting unit is a single quantum well of InGaN or AlGaN, or a plurality of quantum wells composed of InGaN/GaN or AlGaN/GaN, or a GaN-based material doped with indium element or aluminum element.

In an embodiment, the light-emitting element is indium or aluminum.

In an embodiment, a distance between adjacent first light-emitting units is less than or equal to a distance between adjacent second light-emitting units in a circumferential direction of the light-emitting structure or in a radial direction of the light-emitting structure.

In an embodiment, a ratio of an area of the first region to an area of the light-emitting structure ranges from 0.3 to 0.98.

In an embodiment, in an embodiment of the present application, a shape of the first region is any one of a circle, an ellipse and a polygon.

In an embodiment, the light-emitting structure includes a patterned substrate and light-emitting units arranged in layers, where the patterned substrate includes a columnar structure and a groove arranged at intervals, and the light-emitting units include the first light-emitting units arranged in the first region and the second light-emitting units arranged in the second region; and the light-emitting units are arranged on the columnar structure or in the groove.

In an embodiment, the light-emitting units are arranged in a form of radial diffusion or in a form of matrix.

In an embodiment, the first light-emitting unit includes a first pixel, a second pixel and a third pixel respectively, and cross-sectional area of the first pixel, the second pixel and the third pixel increases sequentially; and the second light-emitting unit includes a fourth pixel, a fifth pixel and a sixth pixel respectively, and cross-sectional area of the fourth pixel, the fifth pixel and the sixth pixel increases sequentially.

DETAILED DESCRIPTION OF THE EMBODIMENTS

Technical solutions in embodiments of the present disclosure will be clearly and completely described with reference to accompanying drawings corresponding to the embodiments of the present disclosure in the following description. Apparently, the described embodiments are only some, not all, embodiments of the present disclosure. Based on the embodiments in the present disclosure, all other embodiments obtained by those skilled in the art without making creative efforts fall in a protection scope of the present disclosure.

As for manufacturing of the LED epitaxial wafer, the substrate is rotated at a high speed in a furnace for metal organic chemical vapor deposition (MOCVD), trimethylgallium and nitrogen are used as a gallium source and a nitrogen source respectively, and hydrogen is used as a carrier gas to epitaxially grow a gallium nitride-based semiconductor layer on the substrate.

In order to make a growth of the LED epitaxial wafer more uniform, the substrate is rotated at a high speed. However, because of the high speed of rotation, a centrifugal force makes a thickness of a single epitaxial wafer uneven, resulting in uneven light-emitting wavelength and affecting a display effect.

During a preparation process of LED epitaxial wafers, on the same epitaxial wafer, due to an effect of centrifugal force, a doping rate of a light-emitting element in a central area is different with that in an edge area, resulting in a problem that light emitted from the central area of the LED has a longer wavelength. For example, when the light-emitting element is indium element, a doping rate of the indium element in the central area is higher, and a doping rate of the indium element in the edge area is lower, leading to that light emitted from the central area of the LED has a longer wavelength.

Figure 1:
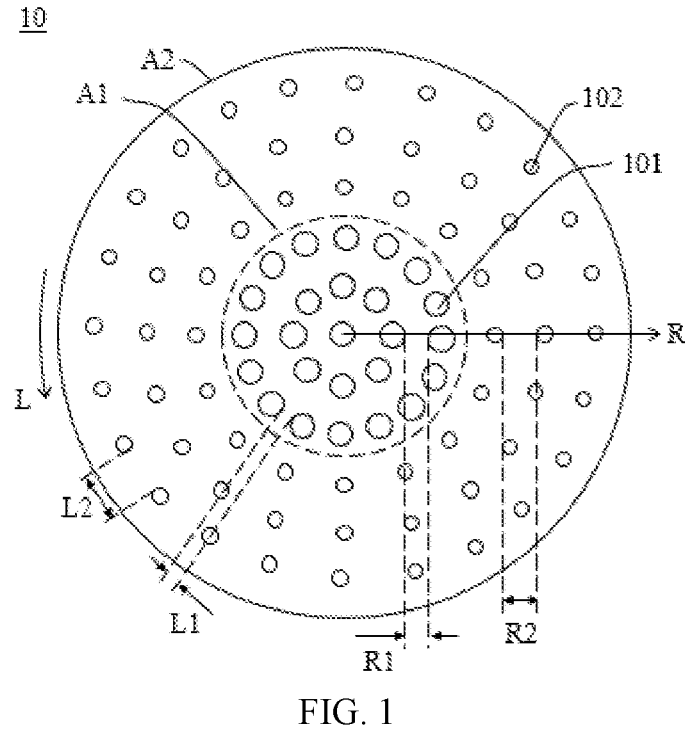
FIG. 1 is a schematic diagram of a light-emitting structure provided by an embodiment of the present disclosure.

In order to solve the above problem, an embodiment of the present disclosure provides a light-emitting structure. FIG. 1 is a schematic diagram of a light-emitting structure provided by an embodiment of the present disclosure. As shown in FIG. 1, the light-emitting structure 10 includes: a first region A1 and a second region A2, where the second region A2 surrounds the first region A1; the first region A1 includes a plurality of the first light-emitting units 101, the second region A2 includes a plurality of second light-emitting units 102, and an area of the first light-emitting unit 101 is greater than an area of the second light-emitting unit 102.

Specifically, as shown in FIG. 1, the second region A2 surrounds the first region A1, the first region A1 is arranged in a central area of the second region A2 and surrounded by the second region A2. An area of the first light-emitting unit 101 is greater than an area of the second light-emitting unit 102, that is, the area of the second light-emitting unit 102 in the second region A2 on the edge is relatively small and the light-emitting units of the second region are relatively sparse, which improves a doping rate of a light-emitting element in the second region A2, so that doping rates of the light-emitting element of the light-emitting structure in the first region and the second region tend to be equal, thereby solving a problem of uneven light-emitting wavelengths in the first region and the second region when the light-emitting unit is prepared by epitaxy.

Specifically, when the light-emitting element is indium element, a doping rate of indium element in an area where the light-emitting units are sparse is increased, so that the doping rate of the indium element in an edge area (that is, the second region A2) may be increased, which enable that the doping rates of the indium element in the first region A1 and the second region A2 of the light-emitting structure tend to be equal and the problem that light emitted from the central area of LED has a longer wavelength may be solved. When the light-emitting element is aluminum, a doping rate of aluminum element in an area where the light-emitting units are sparse is increased is increased, so that the doping rate of the aluminum element in an edge area (that is, the second region A2) may be increased, which enable that the doping rates of the aluminum element in the first region A1 and the second region A2 of the light-emitting structure tend to be equal and the problem that light emitted from the central area of LED has a longer wavelength may be solved.

In an embodiment, a ratio of a light-emitting element content in an active layer of the first light-emitting unit 101 to a light-emitting element content in the active layer of the second light-emitting unit 102 ranges from 0.95 to 1.05. Optionally, the light-emitting element is indium element or aluminum element, and the active layer of the light-emitting unit is a single quantum well of InGaN or AlGaN, or a plurality of quantum wells composed of InGaN/GaN or AlGaN/GaN, or GaN-based materials doped with indium element or aluminum element.

It should be noted that the light-emitting units in the second region A2 is sparser than the light-emitting units in the first region A1, so that the doping rates of the light-emitting element in the first region A1 and in the second region A2 tend to be equal, and a difference, between the first region A1 and the second region A2, of the doped light-emitting element content may be controlled to range from 0 to 0.05 times of the light-emitting element content in the active layer of the first region A1, thereby reducing a difference of light-emitting wavelength between the first region A1 and the second region A2.

Figure 2:
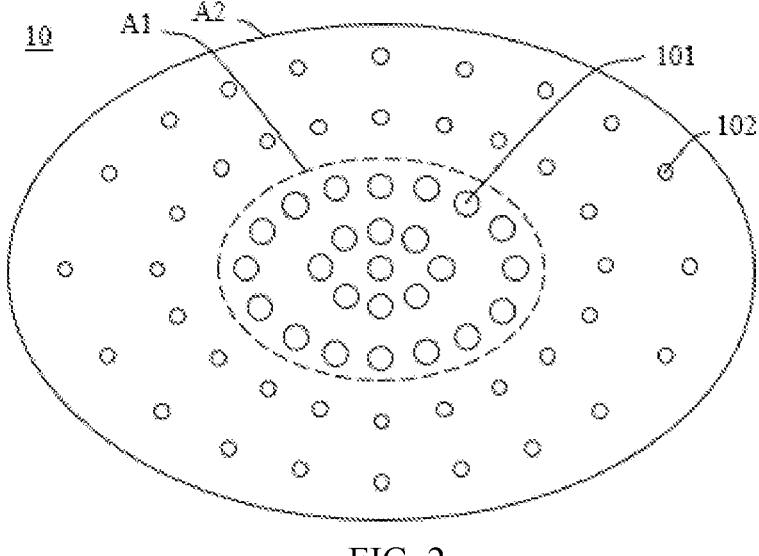
FIG. 2 is a schematic diagram of a light-emitting structure provided by another embodiment of the present disclosure.
Figure 3:
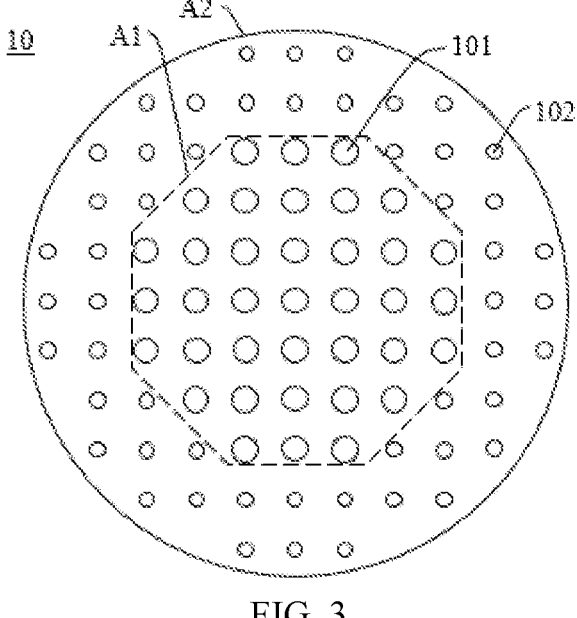
FIG. 3 is a schematic diagram of a light-emitting structure provided by another embodiment of the present disclosure.
Figure 4:
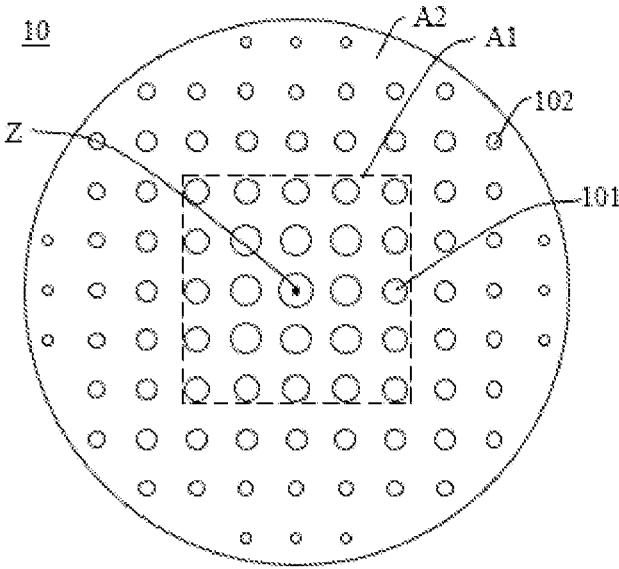
FIG. 4 is a schematic diagram of a light-emitting structure provided by another embodiment of the present disclosure.

In an embodiment, a shape of the first region A1 is any one of a circle, an ellipse or a polygon. As shown in FIG. 1, both the shapes of the first region A1 and the second region A2 are circle. FIG. 2 is a schematic diagram of the light-emitting structure provided by another embodiment of the present disclosure. As shown in FIG. 2, shapes of the first region A1 and the second region A2 are both ellipses; FIG. 3 is a schematic diagram of a light-emitting structure provided by another embodiment of the present disclosure. As shown in FIG. 3, the shape of the first region A1 is an octagon, and the shape of the second region A2 is a circle. FIG. 4 is a schematic diagram of a light-emitting structure provided by another embodiment of the present disclosure, as shown in FIG. 4, the shape of the first region A1 is a quadrilateral, and the shape of the second region A2 is a circle. It should be noted that, as shown in FIG. 1 and FIG. 2, the light-emitting units of the light-emitting structure 10 are arranged in a form of radial diffusion. As shown in FIG. 3 and FIG. 4, the light-emitting units of the light-emitting structure 10 are arranged in a form of matrix.

It should be noted that the above shapes are shapes of an outer contour of the structure, and the present disclosure does not limit a specific shape of the second region, and does not limit the shape of the first region to be equal with second region. Subsequent embodiments of the present disclosure are described with the first region A1 and the second region A2 both being circles.

In an embodiment, As shown in FIG. 1, areas of the plurality of first light-emitting units are equal, and/or, areas of the plurality of second light-emitting units are equal. Specifically, the areas of the plurality of first light-emitting units 101 in the first region A1 are equal, Optionally, the areas of the plurality of second light-emitting units 102 in the second region A2 are equal. A preparation process of the light-emitting units is relatively simple, and the problem of uneven light-emitting wavelengths in the first region and the second region may be improved.

Figures 5, 6, 7, 8, 9:
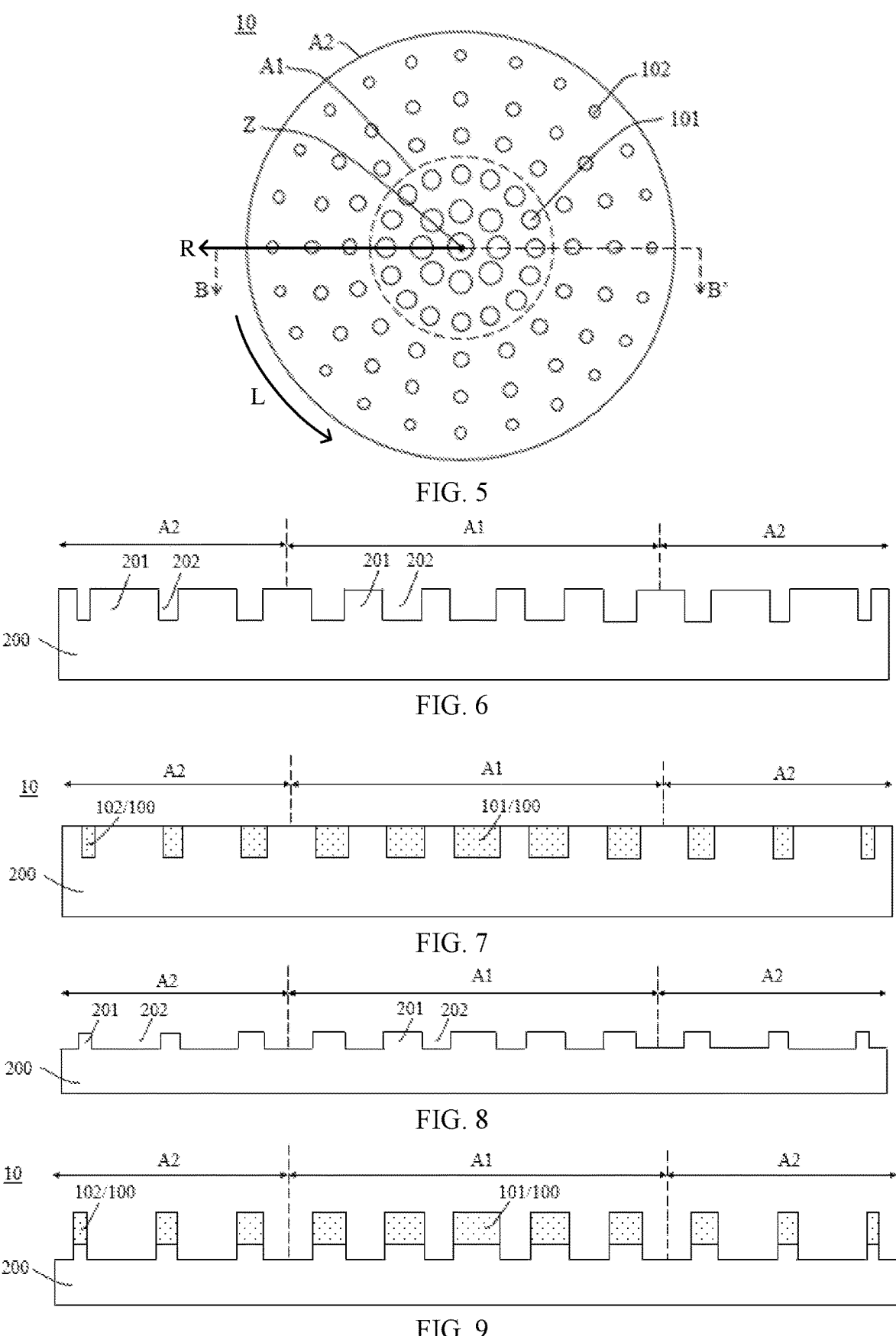
FIG. 5 is a schematic diagram of a light-emitting structure provided by another embodiment of the present disclosure.
FIG. 6 is a schematic diagram of a light-emitting structure provided by another embodiment of the present disclosure.
FIG. 7 is a cross-sectional diagram of an embodiment in the direction of BB' shown in FIG. 5.
FIG. 8 is a schematic diagram of a patterned substrate provided by another embodiment of the present disclosure.
FIG. 9 is a cross-sectional diagram of another embodiment in the direction of BB' shown in FIG. 5.

In an embodiment, FIG. 5 is a schematic diagram of a light-emitting structure provided by another embodiment of the present disclosure. As shown in FIG. 5, the further away the first light-emitting unit 101 from the second region A2 is, the larger the area of the first light-emitting unit 101 is, and/or, the closer the second light-emitting unit 102 to the first region A1 is, the larger the area of the second light-emitting unit 102 is. It can be understood that the further away the light-emitting unit from a center point Z of the light-emitting structure 10 is, the smaller the area of the light-emitting unit is, that is, the smaller the area of the light-emitting unit closer to the outside, which improves a doping rate of a light-emitting element in the outside area (i.e., the second region A2), so that doping rates of the light-emitting element of the light-emitting structure in the first region and the second the area tend to be equal, thereby solving a problem of uneven light-emitting wavelengths in the first region and the second region when the light-emitting unit is prepared by epitaxy. Optionally, as shown in FIG. 4, the further away the light-emitting unit from the center point Z of the light-emitting structure 10 is, the smaller the area of the light-emitting unit is.

In an embodiment, an area of the first light-emitting unit 101 is 1.1~2 times an area of the second light-emitting unit 102, the area of the first light-emitting unit 101 is relatively large.

In an embodiment, a ratio of an area of the first region A1 to an area of the light-emitting structure 10 ranges from 0.3 to 0.98, and the area of the first region A1 accounts for 0.3 to 0.98 of the total area of the first region A1 and the second region A2.

In an embodiment, as shown in FIG. 1, a distance between adjacent first light-emitting units 101 is less than a distance between adjacent second light-emitting units 102 in a circumferential direction or in a radial direction of the light-emitting structure 10. Specifically, in a circumferential direction L of the light-emitting structure 10, a distance L1 between the first light-emitting units 101 is less than a distance L2 between the second light-emitting units 102; or in a radial direction R of the light-emitting structure 10, a distance R1 between the first light-emitting units 101 is less than a distance R2 between the second light-emitting units 102. Compared with the distance between the first light-emitting units 101, the distance between the second light-emitting units 102 is larger and the light-emitting units in the second region A2 are sparser, which improves a doping rate of a light-emitting element in the second region, so that the doping rate of the light-emitting element in the first region A1 and second region A2 tends to be equal, thereby solving a problem that the light emitted from a central area of LED has a longer wavelength during epitaxial manufacturing of the light-emitting unit.

Optionally, as shown in FIG. 5, the further away the light-emitting unit from a center point Z of the light-emitting structure 10 is, the smaller the area of the light-emitting unit is. Moreover, the distance between the second light-emitting units 102 is greater than the distance between the first light-emitting units 101 in the circumferential direction of the light-emitting structure 10 or in the radial direction of the light-emitting structure 10.

In an embodiment, FIG. 6 is a schematic diagram of a light-emitting structure provided by another embodiment of the present disclosure, FIG. 7 is a cross-sectional diagram of an embodiment in the direction of BB' shown in FIG. 5, FIG. 8 is a schematic diagram of a patterned substrate provided by another embodiment of the present disclosure, FIG. 9 is a cross-sectional diagram of another embodiment in the direction of BB' shown in FIG. 5. As shown in FIG. 6 and FIG. 7, the light-emitting structure 10 includes a patterned substrate 200 and light-emitting units 100 arranged in layers, where the patterned substrate 200 includes a columnar structure 201 and a groove 202 arranged at intervals, and the light-emitting unit 100 includes the first light-emitting units 101 arranged in the first region A1 and the second light-emitting units 102 arranged in the second region A2, and the light-emitting units 100 are arranged in the grooves 202. Optionally, as shown in FIG. 8 and FIG. 9, the light-emitting units 100 are arranged on the columnar structures 201.

Specifically, FIG. 6 and FIG. 8 illustrate two kinds of the patterned substrate 200. For the patterned substrate 200 shown in FIG. 6, the light-emitting units 100 are epitaxially manufactured in the groove 202, and a width of the groove 202 in the first region A1 is greater than a width of the groove 202 in the second region A2, that is, the area of the second light-emitting unit 102 is smaller. For the patterned substrate 200 shown in FIG. 8, the light-emitting units 100 are epitaxially manufactured on the columnar structure 201, the width of the columnar structure 201 in the first region A1 is greater than the width of the columnar structure 201 in the second region A2, that is, the area of the second light-emitting unit 102 is smaller.

Optionally, a material of the patterned substrate 200 is any one of sapphire, SiC, Si and GaN-based materials.

Figures 10, 11:
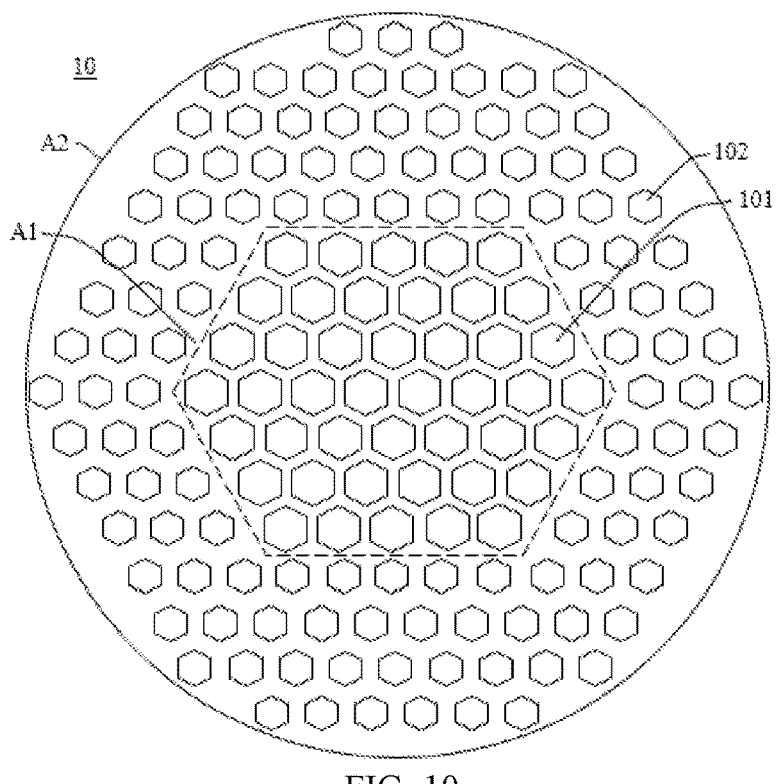
FIG. 10 is a schematic diagram of a light-emitting structure provided by another embodiment of the present disclosure.
FIG. 11 is a schematic diagram of a light-emitting structure provided by another embodiment of the present disclosure.

It should be noted that, the light-emitting unit illustrated in the above embodiment is an example emitting one color, and a cross-sectional shape of the light-emitting unit may be a circle as shown in FIG. 1. Optionally, the cross-sectional shape of the the light-emitting unit may be any one of a circle, an ellipse, a triangle, a quadrangle, a hexagon and other polygons. FIG. 10 is a schematic diagram of the light-emitting structure provided by another embodiment of the present disclosure. As shown in FIG. 10, the cross-sectional shape of the first light-emitting unit 101 and the second light-emitting unit 102 are both hexagonal, and the area of the first light-emitting unit 101 in the first region A1 is greater than the area of the second light-emitting unit 102 in the second region A2.

In an embodiment, FIG. 11 is a schematic diagram of a light-emitting structure provided by another embodiment of the present disclosure. As shown in FIG. 11, a first light-emitting unit 101 includes a first pixel 1011, a second pixel 1012, and a third pixel 1013, and cross-sectional area of the first pixel 1011, the second pixel 1012 and the third pixel 1013 increases sequentially; and the second light-emitting unit 102 includes a fourth pixel 1021, a fifth pixel 1022, and a sixth pixel 1023, and cross-sectional area of the fourth pixel 1021, the fifth pixel 1022 and the sixth pixel 1023 increases sequentially.

Specifically, in the first region A1, light-emitting element contents of the first pixel 1011, the second pixel 1012 and the third pixel 1013 are different. For example, when the light-emitting element is indium element, a doping rate of the indium element in the first pixel 1011 which is a smaller area is the highest, which may control a light-emitting wavelength of the first pixel 1011 to be the longest. Therefore, the first pixel 1011 is controlled to emit red light, the second pixel 1012 is controlled to emit green light, and the third pixel 1013 is controlled to emit blue light, finally realizing full-color display. Similarly, in the second region A2, the fourth pixel 1021 is controlled to emit red light, the fifth pixel 1022 is controlled to emit green light, and the sixth pixel 1023 is controlled to emit blue light.

The present disclosure provides a light-emitting structure, including: a first region and a second region surrounding the first region. The first region includes a plurality of first light-emitting units, and the second region includes a plurality of second light-emitting units. An area of the first light-emitting unit is greater than an area of the second light-emitting unit. The area of the second light-emitting units in the second region arranged on the edge is relatively small, which improves a doping rate of a light-emitting element in the second region, so that doping rates of the light-emitting element of the light-emitting structure in the first region and the second area tend to be equal, thereby solving a problem of uneven light-emitting wavelengths in the first region and the second region when the light-emitting unit is prepared by epitaxy.

It should be understood that the term of term "including" and its variations used in this application are open-ended, that is, "including but not limited to", and the term "an embodiment" means "at least one embodiment". In the specification, schematic expressions of the above terms do not necessarily refer to the same embodiment or example. Moreover, the specific features, structures, materials, or features described may be combined in an appropriate manner in any one or more embodiments or examples. In addition, those skilled in the art may combine and assembly different embodiments or examples described in the specification, as well as the features of different embodiments or examples, without mutual contradiction. The above is only a preferred embodiment of the present disclosure and is not intended to limit it. Any modifications, equivalent replacements, etc. made within the spirit and principles of the present disclosure should be included in the scope of protection of the present disclosure.

What is claimed is:

1. Light-emitting structure, comprising:
a first region and a second region surrounding the first region; wherein
the first region comprises a plurality of first light-emitting units, the second region comprises a plurality of second light-emitting units; and an area of the first light-emitting unit is greater than an area of the second light-emitting unit; and
the closer the second light-emitting unit to the first region is, the larger the area of the second light-emitting unit is.

2. The light-emitting structure according to claim 1, wherein areas of the plurality of first light-emitting units are equal.

3. The light-emitting structure according to claim 1, wherein areas of the plurality of second light-emitting units are equal.

4. The light-emitting structure according to claim 1, wherein the further away the first light-emitting unit from the second region is, the larger the area of the first light-emitting unit is.

5. The light-emitting structure according to claim 1, wherein the area of the first light-emitting unit is 1.1 to 2 times the area of the second light-emitting unit.

6. The light-emitting structure according to claim 1, wherein a ratio of a light-emitting element content in an active layer of the first light-emitting unit to a light-emitting element content in the active layer of the second light-emitting unit ranges from 0.95 to 1.05.

7. The light-emitting structure according to claim 6, wherein the active layer of the first light-emitting unit or the second light-emitting unit is a single quantum well of InGaN or AlGaN, or a plurality of quantum wells composed of InGaN/GaN or AlGaN/GaN, or a GaN-based material doped with indium element or aluminum element.

8. The light-emitting structure according to claim 6, wherein the light-emitting element is indium or aluminum.

9. The light-emitting structure according to claim 1, wherein a distance between adjacent first light-emitting units is less than or equal to a distance between adjacent second light-emitting units in a circumferential direction of the light-emitting structure or in a radial direction of the light-emitting structure.

10. The light-emitting structure according to claim 1, wherein a ratio of an area of the first region to an area of the light-emitting structure ranges from 0.3 to 0.98.

11. The light-emitting structure according to claim 1, wherein a shape of the first region is any one of a circle, an ellipse and a polygon.

12. The light-emitting structure according to claim 1, comprising:
a patterned substrate and light-emitting units arranged in layers, wherein
the patterned substrate comprises a columnar structure and a groove arranged at intervals, and the light-emitting units comprise the first light-emitting units arranged in the first region and the second light-emitting units arranged in the second region; and
the light-emitting units are arranged on the columnar structure or in the groove.

13. The light-emitting structure according to claim 12, wherein the light-emitting units are arranged in a form of radial diffusion or in a form of matrix.

14. The light-emitting structure according to claim 1, wherein the first light-emitting unit comprises a first pixel, a second pixel and a third pixel respectively, and cross-sectional area of the first pixel, the second pixel and the third pixel increases sequentially; and
the second light-emitting unit comprises a fourth pixel, a fifth pixel and a sixth pixel respectively, and cross-sectional area of the fourth pixel, the fifth pixel and the sixth pixel increases sequentially.

* * * * *